(12) United States Patent
Yamamura et al.

(10) Patent No.: US 7,274,091 B2
(45) Date of Patent: Sep. 25, 2007

(54) SEMICONDUCTOR DEVICE AND METHOD OF MANUFACTURING A SEMICONDUCTOR DEVICE

(75) Inventors: Megumi Yamamura, Hyogo-ken (JP); Tetsuya Kaji, Hyogo-ken (JP); Toshihide Shimmei, Hyogo-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 92 days.

(21) Appl. No.: 11/180,636

(22) Filed: Jul. 14, 2005

(65) Prior Publication Data
US 2006/0163719 A1    Jul. 27, 2006

(30) Foreign Application Priority Data
Jul. 14, 2004    (JP)    ............... 2004-206632

(51) Int. Cl.
*H01L 23/495*    (2006.01)
*H01L 23/48*    (2006.01)
*H01L 23/52*    (2006.01)

(52) U.S. Cl. ............ 257/676; 257/666; 257/750; 257/E23.037

(58) Field of Classification Search ............ 257/666, 257/676, 763–766, 750
See application file for complete search history.

(56) References Cited

U.S. PATENT DOCUMENTS 5,134,459 A * 7/1992 Maeda et al. ............ 257/666
5,731,635 A * 3/1998 Bareither et al. ............ 257/763
5,958,607 A * 9/1999 Kim et al. ............ 428/675
6,140,703 A * 10/2000 Cronin et al. ............ 257/766
2003/0134142 A1 * 7/2003 Ivey et al. ............ 428/646

FOREIGN PATENT DOCUMENTS

| JP | 10-92778 | 4/1998 |
| JP | 2002-270676 | 9/2002 |
| JP | 2004-103919 | 4/2004 |

* cited by examiner

*Primary Examiner*—Nitin Parekh
(74) *Attorney, Agent, or Firm*—Oblon, Spivak, McClelland, Maier & Neustadt, P.C.

(57) ABSTRACT

There is provided a semiconductor device including, a bed, a brazing filler metal formed on a first surface of the bed, a barrier metal film formed on a first surface of the brazing filler metal, a alloy film formed on a first surface of the barrier metal film, a semiconductor chip disposed on a first surface of the alloy film, a bonding wire electrically connecting between a terminal formed on a first surface of the semiconductor chip and a lead terminal, and a mold resin molding the bed, the brazing filler metal, the barrier metal film, the alloy film, the semiconductor chip and the bonding wire.

8 Claims, 9 Drawing Sheets

US 7,274,091 B2

1

SEMICONDUCTOR DEVICE AND METHOD OF MANUFACTURING A SEMICONDUCTOR DEVICE

CROSS REFERENCE TO RELATED APPLICATION

This application is based upon and claims the benefit of priority from the prior Japanese Patent Application No. JP2004-206632, filed on Jul. 14, 2004, the entire contents of which are incorporated herein by reference.

FIELD OF THE INVENTION

The present invention relates to a semiconductor device and a method of manufacturing the semiconductor device, and in particular, relates to a semiconductor device including a metal film between a back surface of a thin semiconductor chip and a solder, and a method of manufacturing the semiconductor device.

DESCRIPTION OF THE BACKGROUND

Recently, a semiconductor chip has been required to be mounted in a thin package, such as IC CARD or IC TAG et al., or in a multi chip package in which semiconductor chips are stacked. A semiconductor chip including a metal film formed on a back surface has been required to be thinly processed on a thickness of the semiconductor chip.

Proceeding of miniaturization and high integration of a semiconductor device has been accompanied with an enlargement of semiconductor substrate diameter. The semiconductor substrate is thinned by back surface polishing et al. and is separated to a plurality of semiconductor chips by dicing in processing steps of back surface of the semiconductor substrate. The semiconductor substrate thickness below 100 µm easily causes generation of crack and lack in the substrate at processing and moving in manufacturing steps of the semiconductor device. Japanese Patent Publication (Kokai) No. H10-92778 discloses a method of sticking a protective tape on a thinned semiconductor substrate suppresses generation of crack in the thinned semiconductor substrate at processing and moving in manufacturing steps of the semiconductor device.

On the other hand, the processing steps mentioned above have a several problems on assembling a semiconductor substrate or a semiconductor chip. When the semiconductor substrate with a large diameter has a thickness ranged from a several tens of µms to 90 µm, local stress applied to the semiconductor substrate causes generation of local crack and lack of the semiconductor substrate in processing and moving. Furthermore, in process steps being formed a metal film on a back surface of the thinned semiconductor substrate or the semiconductor chip, enlargement of coupling strength between the back surface and the metal film becomes difficult. Moreover, in process steps fully being cut a thinned semiconductor substrate with a metal film on a back surface by blade-dicing, bending strength of a semiconductor chip becomes smaller so that improvement of reliability on a resin-molded semiconductor device including the semiconductor chip becomes difficult.

SUMMARY OF THE INVENTION

According to an aspect of the invention, there is provided a semiconductor device including, a bed, a brazing filler metal formed on a first surface of the bed, a barrier metal film formed on a first surface of the brazing filler metal, a alloy film formed on a first surface of the barrier metal film, a semiconductor chip disposed on a first surface of the alloy film, a bonding wire electrically connecting between a terminal formed on a first surface of the semiconductor chip and a lead terminal, and a mold resin molding the bed, the brazing filler metal, the barrier metal film, the alloy film, the semiconductor chip and the bonding wire.

According to another aspect of the invention, there is provided a semiconductor device including, a bed, a brazing filler metal formed on a first surface of the bed, a barrier metal film formed on a first surface of the brazing filler metal, a alloy film formed on a first surface of the barrier metal film, a semiconductor chip formed on a first surface of the alloy film, a bonding wire electrically connecting between a terminal formed on a first surface of the semiconductor chip and a lead terminal, and a ceramic package airproofed the bed, the brazing filler metal, the barrier metal film, the alloy film, the semiconductor chip and the bonding wire.

According to another aspect of the invention, there is provided a method of manufacturing a semiconductor device including, sticking a first protective tape on a first surface of a semiconductor substrate, polishing a second surface opposed to the first surface of the semiconductor substrate, sticking a second protective tape on the second surface of the semiconductor substrate, removing the first protective tape, dicing on the first surface of the semiconductor substrate so as to separate the semiconductor substrate to a plurality of semiconductor chips, sticking a third protective tape on the first surface of the semiconductor substrate, removing the second protective tape, forming an alloy film contained Au on the second surface of the semiconductor substrate, and forming a barrier metal film on the alloy film contained Au.

DETAILED DESCRIPTION OF THE INVENTION

Figure 1:
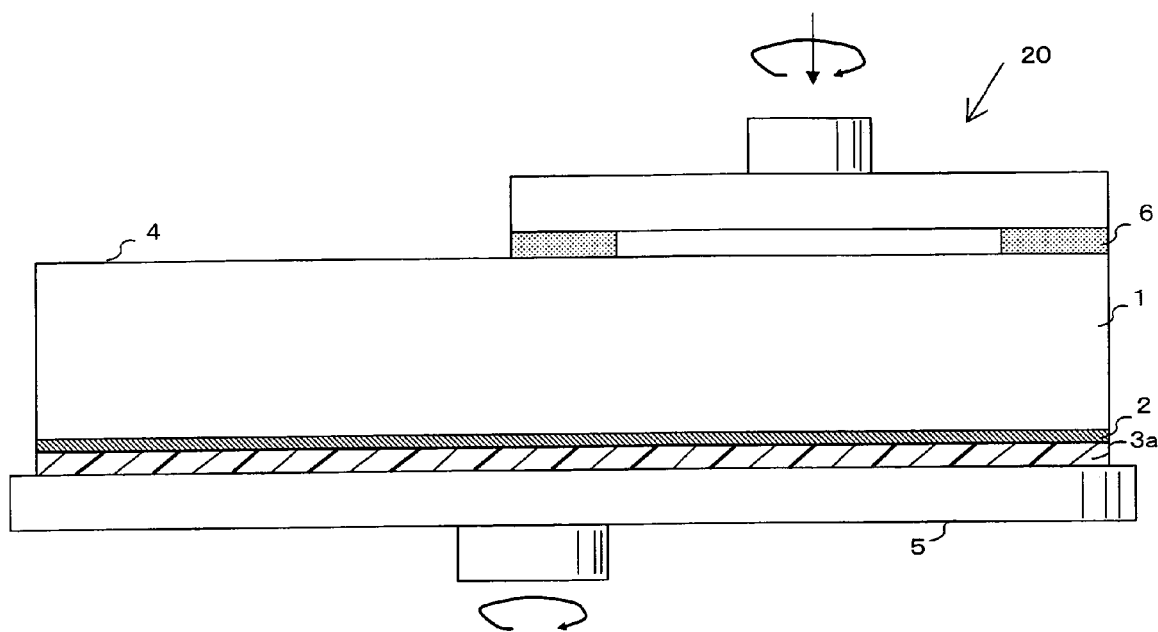
FIG. 1 is a cross-sectional schematic diagram showing a method of manufacturing a semiconductor device according to a first embodiment of the present invention.

Embodiments of the present invention will be described below in detail with reference to the drawing mentioned above.

First, according to a first embodiment of the present invention, a semiconductor device and a method of manufacturing the semiconductor device are explained with reference to FIGS. 1-5. FIGS. 1-4 are cross-sectional schematic diagrams showing manufacturing steps of the semiconductor device in order steps. FIG. 5 is a cross-sectional schematic diagram showing a resin-molded semiconductor device including thinly processed semiconductor chip.

As shown in FIG. 1, various sorts of semiconductor elements are formed on a first surface of a semiconductor substrate 1 having a diameter of 200 mm, for example a silicon substrate, by using well-known manufacturing-processes in semiconductor technology. A first protective tape 3a protecting various sorts of the semiconductor elements is stuck on a first surface 2 of the semiconductor substrate 1.

A second surface 4, a back surface of the semiconductor substrate 1, opposed to the first surface 2 is polished by using a grinding machine 20. The grinding machine 20 has a vacuum absorption table 5 retaining the semiconductor substrate 1 by vacuum absorption and a grinding stone 6 opposed to the vacuum absorption table 5. The vacuum absorption table 5 absorbing the semiconductor substrate 1 is rotated and the grinding stone 6 also is rotated with a horizontal movement. In the back surface polishing method, the first surface 2 of the semiconductor substrate 1 on which stuck the first protective tape 3a is absorbed on the vacuum absorption table 5. Successively, the back surface polishing is performed by the grinding stone 6 with rough meshes. Moreover, the second surface 4 is polished by the grinding stone 6 with fine meshes so as to remove a micro crushed-layer generated by the polishing process using rough meshes. As a result, the second surface 4 of the semiconductor substrate 1 is mirror-polished so as to have a plane roughness (Ra) of micron order or less, for example below 0.01 μm.

Next, semiconductor substrate 1 is thinned below 90 μm thick, for example 30 μm. In addition, dry etching, for example fluorine gas plasma technique, may be performed to remove micro crushed-layer generated in the back surface polishing instead of grinding using the grinding stone 6 with the fine meshes. A plane roughness (Ra) measurement is conducted by contact method surface roughness measurement equipment, however, non-contact method by laser surface roughness measurement equipment and non-contact method surface roughness measurement equipment may also be used.

Figure 2:
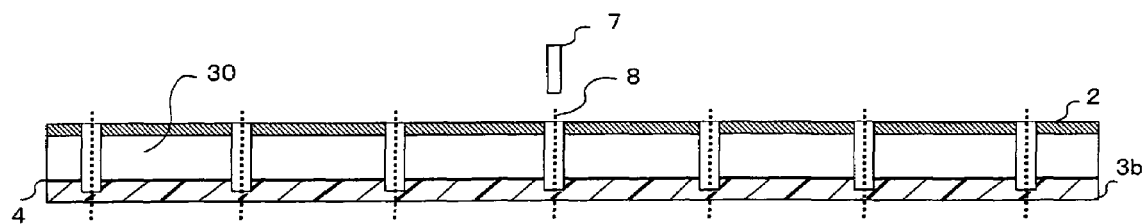
FIG. 2 is a cross-sectional schematic diagram showing the method of manufacturing the semiconductor device according to the first embodiment of the present invention.

As shown in FIG. 2, a second protective tape 3b is stuck on the second surface 4 of the semiconductor substrate 1, and the first protective tape 3a on the first surface 2 is removed. The second protective tape 3b is stuck on the second surface 4 of the semiconductor substrate 1 by the processing steps.

The silicon substrate 1 is separated to a plurality of silicon chips by full-cut dicing (full-cut blade-dicing). The silicon substrate 1 is cut from the first surface 2 of semiconductor substrate 1 into the second protective tape 3b on the second surface 4 by using a dicing saw 7 focusing on a cutting line 8. A blade of the dicing saw 7 reaches into a portion of the second protective tape 3b through the silicon substrate 1. As a result, the silicon substrate 1 is separated to a plurality of silicon chips 30.

A position of the cutting line 8 in the silicon substrate 1 is determined by detecting a metal interconnection layer formed on the first surface 2 or a dicing line edge formed on the first surface 2. The blade of the dicing saw 7 may have a grain size with capability of suppressing a tipping generation on the back surface and forming a comparatively narrow calf width (a width of a dicing groove)

Figure 3:
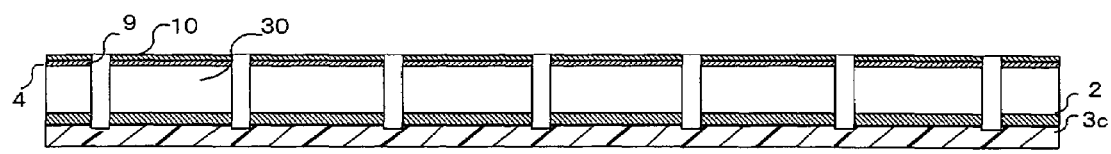
FIG. 3 is a cross-sectional schematic diagram showing the method of manufacturing the semiconductor device according to the first embodiment of the present invention.

As shown in FIG. 3, a third protective tape 3c is stuck on the first surface 2 of a plurality of the semiconductor chips 30, subsequently the protective tape 3b on the second surface 4 of the semiconductor chips 30 is removed. An Au—Sn film 9 of a binary alloy is formed on the second surface 4 of the semiconductor chips 30 by using vacuum evaporation. The Au—Sn film 9 is formed to obtain tight adhesion to the second surface 4 of the semiconductor chips 30. An Au-ratio in the Au—Sn film 9 may be 30~80 atomic % When the Au-ratio is out of the range in 30~80 atomic %, adhesion strength between the second surface 4 of the semiconductor chips 30 and the Au—Sn film 9 is decreased. Furthermore, an Au—Ge film and an Au—Sb film may be used instead of the Au—Sn film 9. In this case, an Au-ratio in the Au may be ratio 30~80 atomic %.

A Ni film 10 is formed on the Au—Sn film 9 by vacuum evaporation. The Ni film 10 has a function as a barrier metal separating a brazing filler metal like solder and the Au—Sn film 9 and preventing a reaction between the brazing filler metal like a solder and the Au—Sn film 9 while the semiconductor chip 30 is molded by a resin. In this process, Cr, W or Ti may be used instead of the Ni film 10. In addition, when a bending strength of the semiconductor chip 30 is enlarged, dry etching using a fluorine gas plasma, for example, may be performed to remove a micro tipping, a micro crack or crushed layer in a cutting surface of the semiconductor chips 30, before the Au—Sn film 9 is formed on the semiconductor chip 30. In this case, as the second surface 4 of the semiconductor chips 30 and the Au—Sn film 9 is tightly coupled each other, a plane roughness (Ra) at the second surface 4 of the semiconductor chips 30 must not be above 0.01 μm.

Figure 4:
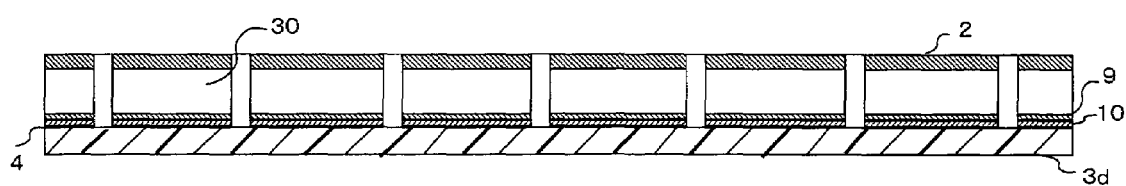
FIG. 4 is a cross-sectional schematic diagram showing the method of manufacturing the semiconductor device according to the first embodiment of the present invention.
Figure 5:
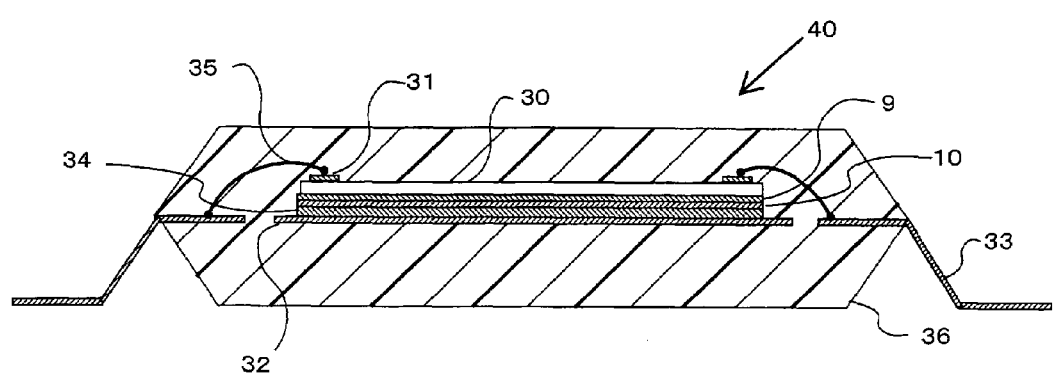
FIG. 5 is a cross-sectional schematic diagram showing a semiconductor device including a thin semiconductor chip molded with a mold resin according to the first embodiment of the present invention.

As shown in FIG. 4, a fourth protective tape 3d is stuck on the second surface 4 of the semiconductor chips 30, and the third protective tape 3c on the first surface 2 is removed. The thin semiconductor chip 30 is transferred to mounting steps in which a resin-molded thin-type semiconductor device is formed.

As shown in FIG. 5, a resin-molded semiconductor device 40 includes the thinned semiconductor chip molded by a resin 36 using well-known manufacturing-processes in semiconductor technology, a solder 34 as a brazing filler metal is formed at a surface of the bed 3 made of Cu et al. In addition, Sn—Bi, Sn—Ag—Cu—In, Sn—Zn or an eutectic solder of Sn—Pb may be available as the solder 34. Moreover, a solder bump, a gold bump or Au film may be used as a solder instead of the solder 34.

A Ni film 10 is formed at a surface (the first surface) of the solder 34, an Au—Sn film 9 is formed at a surface (the first surface) of the Ni film 10, and the semiconductor chip 30 is disposed on the Au—Sn film 9, where the second surface 4 of the semiconductor chip 30 contacts with the surface (the first surface) of the Au—Sn film 9. A terminal 31 formed at the first surface of the semiconductor chip 30 and a lead terminal 33 is electrically connected by a bonding wire 35. The bed 32, the semiconductor chip 30, the solder 34, the Ni film 10 and the bonding wire 35 is molded by the resin 36 made of epoxy resin et al.

As mentioned above, in the first embodiment of a semiconductor device and the method of manufacturing the semiconductor device, the Ni film 10 and the Au—Sn film 9 is formed between the solder 34 on the bed 32 and the second surface 40 having the plane roughness (Ra) below 01 μm of the semiconductor chip 30.

Furthermore, the second surface 4 of the semiconductor chip 30 and the Au—Sn film 9, Au—Sn film 9 and the Ni film 10, the Ni film 10 and the solder 34, and the solder 34 and the bed 32, respectively, are tightly coupled at the highest temperature in processing steps such as mounting, bonding and resin-molding the semiconductor chip 30, for example 300° C. Therefore, the semiconductor chip 30 is tightly coupled to the bed 32. As a result, characteristics and reliability of the resin-molded semiconductor device 40 can be improved.

Moreover, when working and moving on the semiconductor substrate in back surface processing steps, the protective tape is essentially stuck on the first surface 2 or the second surface 4 of the thinly-processed semiconductor substrate 1 or the semiconductor chip 30. Consequently, a local crack or a local lack of the semiconductor substrate 1 or the semiconductor chip 30 can be greatly decreased as compared to a conventional case.

Furthermore, as dicing the semiconductor substrate 1 is performed before the Au—Sn film 9 and the Ni film 10 is formed at the second surface 4 of the semiconductor chip 30, generation of micro tipping or micro cracking in the second surface 4 of the semiconductor chip 30 can be suppressed.

In this embodiment, the technology is applied to a resin-molded semiconductor device including a semiconductor chip covered with a resin. However, the technology is also applied to an air-proofed semiconductor device including a semiconductor chip by using ceramic package et al.

Figure 6:
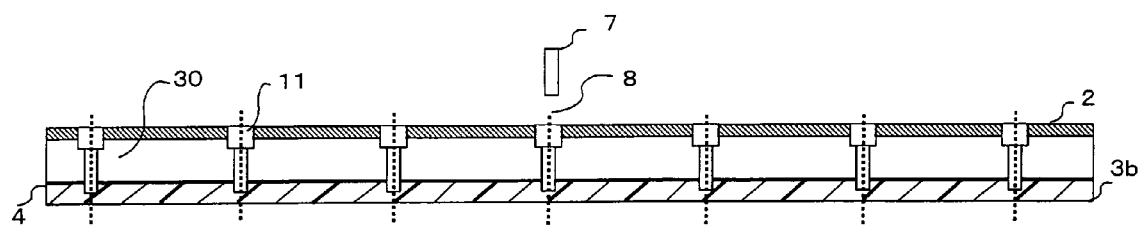
FIG. 6 is a cross-sectional schematic diagram showing a method of manufacturing a semiconductor device according to a second embodiment of the present invention.

Processing steps of a semiconductor device according to a second embodiment of the present invention is explained hereinafter in detail with reference to FIG. 6. FIG. 6 is a cross-sectional schematic diagram showing a semiconductor device. The second embodiment has a feature that a shallow groove is formed on the dicing area of the semiconductor chip surface.

In FIG. 6, a portion of a same composition as the first embodiment is attached the same number. Therefore, explanation on the same number in FIG. 6 is omitted and explanation on the different number in FIG. 6 is performed.

A back surface polishing is performed to the first surface of the semiconductor substrate through the same processing steps as the first embodiment. As shown in FIG. 6, a shallow groove 11 is formed on the first surface 2 of the semiconductor substrate 1 focusing on a cutting line by laser grooving. A semiconductor laser is used for a tool in the laser grooving; however, dicing saw 7 with a wide calf width may be utilized instead of laser grooving to form the shallow groove 11.

The silicon substrate 1 is cut from the first surface 2 of semiconductor substrate 1 into the second protective tape 3b on the second surface 4 focusing on a cutting line 8 by using a dicing saw 7 with a narrower calf width than that of shallow groove 11. A blade of the dicing saw 7 reaches into a portion of the second protective tape 3b through the silicon substrate 1. As a result, the silicon substrate 1 is separated to a plurality of the silicon chips 30. The calf width in the dicing is formed narrower than that in shallow groove 11.

The third protective tape 3c is stuck on the first surface 2 of the semiconductor chips 30 and the protective tape 3b on the second surface 4 of the semiconductor chips 30 is removed. As successive process steps are the same as those in the first embodiment, explanation on the process steps is omitted.

The semiconductor chips 30 manufactured by the processing steps mentioned above include the shallow grooves 11 formed at both side of the surface. As the surface is retreated from the second surface 4, a metal in an evaporation process is not sputtered.

As mentioned above, in the second embodiment of the semiconductor device and the method of manufacturing the semiconductor device, when working and moving on the semiconductor substrate 1 in back surface processing steps, the protective tape is essentially stuck on the first surface 2 or the second surface 4 of the thinly-processed semiconductor substrate 1 or the semiconductor chips 30. Consequently, a local crack or a local lack of the semiconductor substrate 1 or the semiconductor chips 30 can be greatly decreased as same as the first embodiment.

The Ni film 10 and the Au—Sn film 9 is formed between the solder 34 on the bed 32 and the second surface 40 having the plane roughness (Ra) below 0.1 μm of the semiconductor chips 30.

Furthermore, the surface is retreated from the second surface 4 of the semiconductor substrate 1 in the dicing process. Subsequently, the Au—Sn film 9 and the Ni film 10 are formed on the second surface 4 of the semiconductor chip 30; as a result, metal sputtering to the surface of the semiconductor chip 30 in a metal evaporation process is greatly decreased as compared to the first embodiment.

Figure 7:
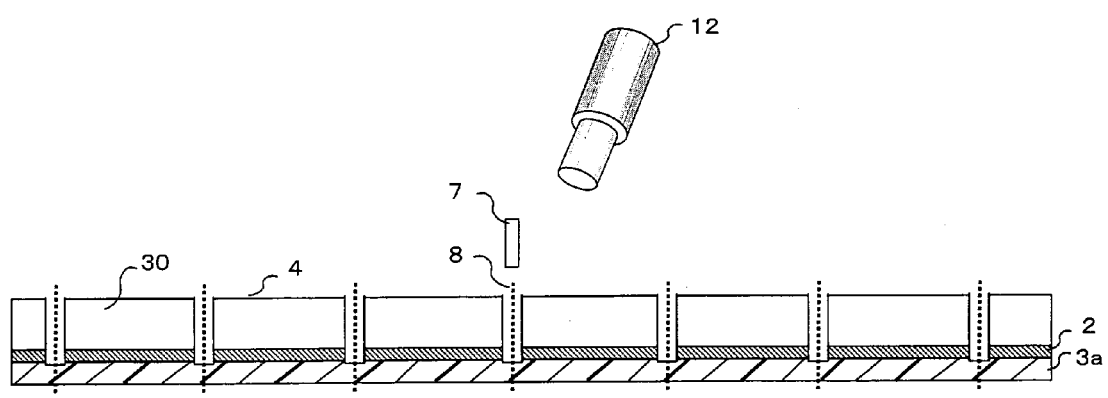
FIG. 7 is a cross-sectional schematic diagram showing a method of manufacturing a semiconductor device according to a third embodiment of the present invention.

Processing steps of a semiconductor device according to a third embodiment of the present invention is explained hereinafter in detail with reference to FIG. 7. FIG. 7 is a cross-sectional schematic diagram showing a semiconductor device. The present embodiment has a feature that processing steps of back surface is shortened.

In FIG. 7, a portion of a same composition as the first embodiment is attached the same number. Therefore, explanation on the same number in FIG. 7 is omitted and explanation on the different number in FIG. 7 is performed.

A back surface polishing is performed to the first surface of the semiconductor substrate through the same processing steps as the first embodiment.

The silicon substrate 1 is separated to a plurality of silicon chips by full-cut dicing (full-cut blade-dicing). The silicon substrate 1 is cut from the second surface 4 of semiconductor substrate 1 into the first protective tape 3a on the first surface 2 by using the dicing saw 7 focusing on a cutting line 8. A blade of the dicing saw 7 reaches into a portion of the first protective tape 3a through the silicon substrate 1. As a result, the silicon substrate 1 is separated to a plurality of the silicon chips 30.

A position of the cutting line 8 in the silicon substrate 1 is determined by detecting a metal interconnection layer formed on the first surface 2 or a dicing line edge formed on the first surface 2 using an infra-red microscope 12 from a side of the second surface 4. Infra-red wave length ($\lambda$) used for infra-red microscopy is 1,300-1,600 nm, for example 1,360 nm for a silicon device. The blade of the dicing saw 7 may have a grain size with capability of suppressing a tipping of the back surface and forming a comparatively narrow calf width.

The Au—Sn film 9 and the Ni film 10 are formed in order steps where the first protective tape 3a is stuck on the first surface 2 of the silicon substrate 1. As successive process steps are the same as those in the first embodiment, explanation on the process steps is omitted.

As mentioned above, in the third embodiment of a semiconductor device and the method of manufacturing the semiconductor device, when working and moving of the semiconductor substrate 1 in back surface processing steps, the protective tape is essentially stuck on the first surface 2 of the thinly-processed semiconductor substrate 1 or the semiconductor chip 30. Consequently, a local crack or a local lack of the semiconductor substrate 1 or the semiconductor chip 30 can be greatly decreased as same as the first embodiment.

Furthermore, as dicing the semiconductor substrate 1, forming the Au—Sn film 9, and forming the Ni film 10 are successively performed in processing steps where the first protective tape 3a is stuck on the first surface 2 of the semiconductor substrate 1, processing steps are decreased as compared to those in the first embodiment.

Figure 8:
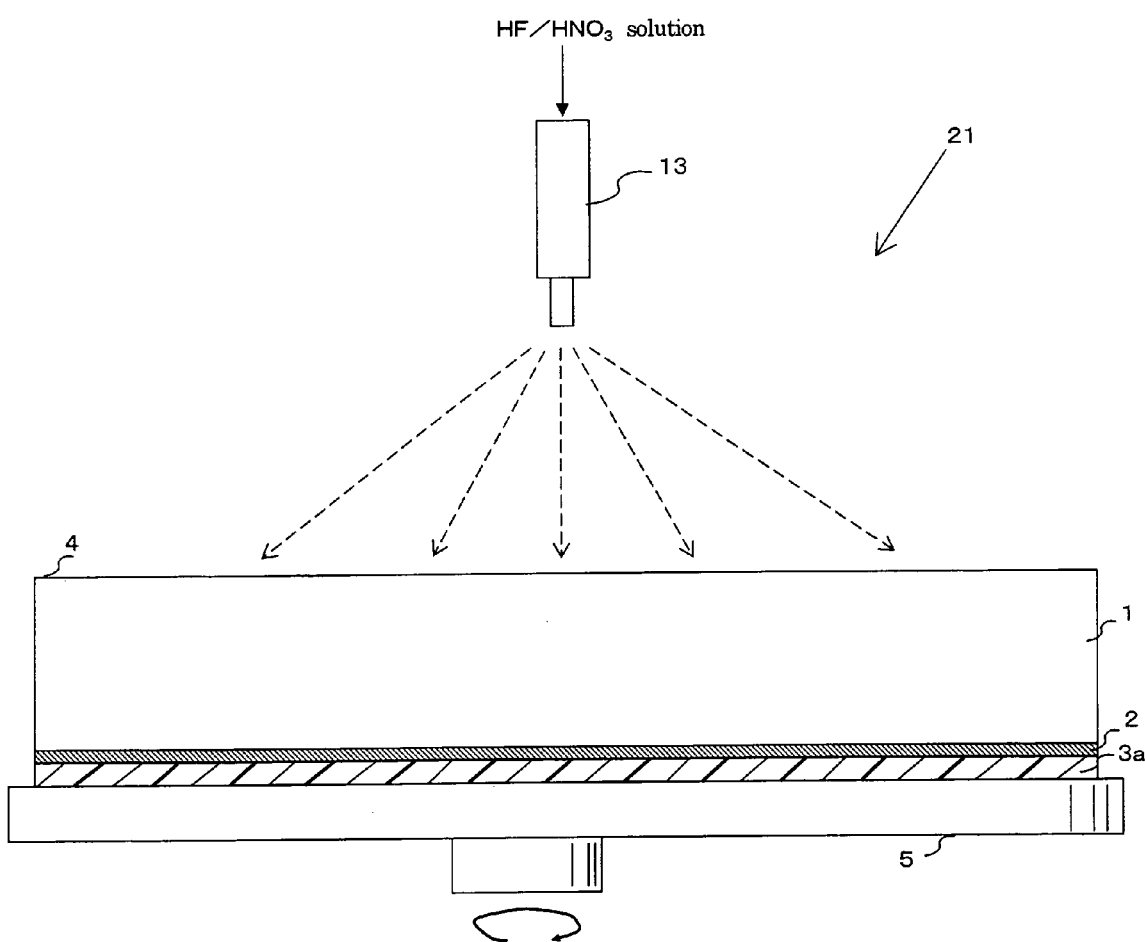
FIG. 8 is a cross-sectional schematic diagram showing a method of manufacturing a semiconductor device according to a fourth embodiment of the present invention.

Processing steps of a semiconductor device according to a fourth embodiment of the present invention is explained hereinafter in detail with reference to FIGS. 7-8. FIGS. 7-8 are cross-sectional schematic diagrams showing manufacturing steps of the semiconductor device. The present embodiment has a feature that the back surface of a semiconductor substrate is roughened by wet etching.

Figure 9:
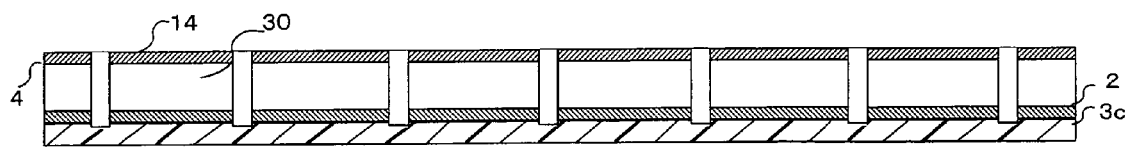
FIG. 9 is a cross-sectional schematic diagram showing the method of manufacturing the semiconductor device according to the fourth embodiment of the present invention.

In FIG. 8-9, a portion of a same composition as the first embodiment is attached the same number. Therefore, explanation on the same number in FIG. 7 is omitted and explanation on the different number in FIG. 7 is performed.

A back surface polishing is performed to the first surface of the semiconductor substrate by using the grinding stone 6 with rough meshes through the same processing steps as the first embodiment.

A micro crushed-layer generated by back surface polishing is removed by using the semiconductor substrate back surface etching machine 21. As shown in FIG. 8, the semiconductor substrate back surface etching machine 21 includes the vacuum absorption table 5 and a nozzle 13. The vacuum absorption table 5 is rotated while retaining the semiconductor substrate 1 by vacuum absorption. The nozzle 13 sprays HF—HNO$_3$ onto the second surface 4 of the semiconductor substrate 1. As a result, the second surface 4 of the semiconductor substrate 1 is flattened to be a plane roughness (Ra) of 0.05-0.4 μm. H$_2$SO$_4$ may be added in HF/HNO$_3$ solution.

Next, cutting thinned semiconductor substrate 1 conducts separating to a plurality of the semiconductor chip 30 through the same processing steps as the first embodiment.

As shown in FIG. 9, the third protective tape 3c is stuck on the first surface 2 of the semiconductor chips 30, and the protective tape 3b on the second surface 4 of the semiconductor chips 30.

Moreover, a V—Ni—Au layered metal film 14 is formed on the second surface 4 of semiconductor chips 30 by vacuum evaporation et al. The V—Ni metal film is formed to improve adhesion between the semiconductor chips 30 and the Au film. A thickness of the V—Ni film is comparatively thinner, such as 100 nm, than a thickness of the Au film, such as above a few μm. Furthermore, Ti, TiN, WN or WSi may be used instead of V—Ni, and Cu or W may be used instead of Au. Moreover, sputtering may be used instead of evaporation. As successive process steps are the same as those in the first embodiment, explanation on the process steps is omitted.

As mentioned above, in the fourth embodiment of the semiconductor device and the method of manufacturing the semiconductor device, when working and moving on the semiconductor substrate 1 in back surface processing steps, the protective tape is essentially stuck on the first surface 2 or the second surface 4 of the thinly-processed semiconductor substrate 1 or the semiconductor chips 30. Consequently, a local crack or a local lack of the semiconductor substrate 1 or the semiconductor chips 30 can be greatly decreased as same as the first embodiment.

Furthermore, as a plane roughness (Ra) of the second surface 4 semiconductor substrate 1 is 0.05-0.4 μm thick, the second surface 4 of the semiconductor substrate 1 is tightly coupled to the layered metal film 14 as same as the first embodiment.

Dicing the semiconductor substrate 1, forming the Au—Sn film 9, and forming the Ni film 10 are successively performed in processing steps where the first protective tape 3a is stuck on the first surface 2 of the semiconductor substrate 1; processing steps are decreased as compared to those in the first embodiment.

Other embodiments of the present invention will be apparent to those skilled in the art from consideration of the specification or practice of the invention disclosed herein. It is intended that the specification or example embodiments be considered as exemplary only with a true scope or spirit of the invention being indicated by the claims that follow. The invention can be carried out by being variously modified within a range not deviated from the gist of the invention.

For example, in the present embodiments, full-cut dicing is performed by dicing saw, however, is also performed by using laser. Moreover, a resin-molded semiconductor device including a semiconductor chip molded with a resin, which used in the second embodiment and the third embodiment as the manufacturing method can improve on device characteristics and device reliability as same as the first embodiment.

What is claimed is:

1. A semiconductor device, comprising:
   a bed;
   a brazing filler metal formed on a first surface of the bed;
   a barrier metal film formed on a first surface of the brazing filler metal;
   a alloy film formed on a first surface of the barrier metal film;
   a semiconductor chip disposed on a first surface of the alloy film, the semiconductor chip having a first surface and a second surface opposed to the first surface, the second surface of the semiconductor chip contacting with the first surface of the alloy film, the second surface of the semiconductor chip has a plane roughness below 0.01 μm;
   a bonding wire electrically connecting between a terminal formed on a first surface of the semiconductor chip and a lead terminal; and
   a mold resin molding the bed, the brazing filler metal, the barrier metal film, the alloy film, the semiconductor chip and the bonding wire.

2. The semiconductor device according to claim 1, wherein the alloy film is composed of Au—Sn, Au—Sb or Au—Ge and is contained Au ranged from 30% to 80%.

3. The semiconductor device according to claim 1, wherein the barrier metal film is made of Ni, Cr, W or Ti.

4. The semiconductor device according to claim 1, wherein the brazing filler metal is made of solder.

5. A semiconductor device, comprising:
   a bed;
   a brazing filler metal formed on a first surface of the bed;
   a barrier metal film formed on a first surface of the brazing filler metal;

a alloy film formed on a first surface of the barrier metal film;

a semiconductor chip disposed on a first surface of the alloy film, the semiconductor chip having a first surface and a second surface opposed to the first surface, the second surface of the semiconductor chip contacting with the first surface of the alloy film, the second surface of the semiconductor chip has a plane roughness below 0.01 μm;

a bonding wire electrically connecting between a terminal formed on a first surface of the semiconductor chip and a lead terminal; and a ceramic package airproofing the bed, the brazing filler metal, the barrier metal film, the alloy film, the semiconductor chip and the bonding wire.

6. The semiconductor device according to claim 5, wherein the alloy film is composed of Au—Sn, Au—Sb or Au—Ge and is contained Au ranged from 30% to 80%.

7. The semiconductor device according to claim 5, wherein the barrier metal film is made of Ni, Cr, W or Ti.

8. The semiconductor device according to claim 5, wherein the brazing filler metal is made of solder.

* * * * *